United States Patent
Wakizaka et al.

(10) Patent No.: US 6,955,848 B2
(45) Date of Patent: Oct. 18, 2005

(54) CURABLE COMPOSITION AND MULTILAYERED CIRCUIT SUBSTRATE

(75) Inventors: Yasuhiro Wakizaka, Kawasaki (JP); Kanji Yuyama, Kawasaki (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 10/240,400

(22) PCT Filed: Mar. 30, 2001

(86) PCT No.: PCT/JP01/02798

§ 371 (c)(1), (2), (4) Date: Sep. 30, 2002

(87) PCT Pub. No.: WO01/72902

PCT Pub. Date: Oct. 4, 2001

(65) Prior Publication Data

US 2003/0146421 A1 Aug. 7, 2003

(30) Foreign Application Priority Data

Mar. 30, 2000 (JP) .................................. 2000-095184

(51) Int. Cl.⁷ .......................... H05K 1/00; C08L 55/00; C08L 63/00

(52) U.S. Cl. ................ 428/209; 174/258; 524/553; 524/554; 524/556; 524/589; 524/595; 524/606; 524/612; 523/451; 523/452

(58) Field of Search ............... 428/209; 174/258, 174/256; 524/553–556, 589, 595, 606, 612; 523/451–452

(56) References Cited

U.S. PATENT DOCUMENTS

| | | | | |
|---|---|---|---|---|
| 4,269,947 A | * | 5/1981 | Inata et al. ..................... 525/10 |
| 4,292,151 A | * | 9/1981 | Inata et al. ................... 522/137 |
| 4,691,045 A | * | 9/1987 | Fukuchi et al. .............. 560/185 |
| 5,180,767 A | | 1/1993 | Sakai et al. | |
| 6,001,488 A | * | 12/1999 | Kataoka et al. .............. 428/447 |
| 6,270,900 B1 | * | 8/2001 | Wakizaka et al. ............ 428/416 |

FOREIGN PATENT DOCUMENTS

| | | | |
|---|---|---|---|
| EP | 0 494 722 A | | 7/1992 |
| JP | 55072304 | * | 5/1980 |
| JP | 55072305 | * | 5/1980 |
| JP | 56-98161 A | | 8/1981 |
| JP | 1-174552 A | | 7/1989 |
| JP | 2-233757 A | | 9/1990 |
| JP | 2-255848 A | | 10/1990 |
| JP | 02 233757 A | | 12/1990 |
| JP | 07 097501 A | | 8/1995 |
| JP | 7-330970 A | | 12/1995 |
| JP | 08 236942 A | | 9/1996 |
| JP | 8-236942 A | | 9/1996 |
| JP | 10-316665 | * | 12/1998 |
| JP | 11-106597 A | | 4/1999 |
| JP | 11-189743 A | | 7/1999 |

OTHER PUBLICATIONS

JP 07 330970 A; Patent Abstracts of Japan, vol. 1996, No. 04, Dec. 19, 1995.
JP 11 106597 A; Patent Abstracts of Japan, vol. 1999, No. 09, Apr. 20, 1999.

* cited by examiner

*Primary Examiner*—Cathy F. Lam
(74) *Attorney, Agent, or Firm*—Birch, Stewart, Kolasch & Birch, LLP

(57) ABSTRACT

This invention provides a multi-layer circuit board excellent in flame resistance, insulating property and adhesion and not generating detrimental substances when burnt, and a curable composition suitable for obtaining the multi-layer circuit board. The curable composition contains an insulating resin such as an alicyclic olefin polymer or an aromatic polyether polymer, a nitrogen-type curing agent such as 1,3-diallyl-5-glycidyl isocyanurate and a phosphorus-type flame retardant such as phosphoric acid ester amide, and is molded into a film by a solution casting method. The film so formed is laminated on an internal layer board and is cured to give the multi-layer circuit substrate.

5 Claims, No Drawings

CURABLE COMPOSITION AND MULTILAYERED CIRCUIT SUBSTRATE

This application is the national phase under 35 U.S.C. § 371 of PCT International Application No. PCT/JP01/02798 which has an International filing date of Mar. 30, 2001, which designated the United States of America.

TECHNICAL FIELD

This invention relates to a curable composition. More particularly, the invention relates to a curable composition for obtaining a multi-layer circuit board that is excellent in both an insulating property and in adhesion, and does not generate detrimental substances when burnt.

BACKGROUND ART

As electronic apparatuses have become smaller in size and multi-functional, a higher density has been required for circuit boards used for the electronic apparatuses.

Ordinary means for achieving a higher density of circuit boards include fabricating circuit boards into a multi-layer structure, as is well known in the art. The multi-layer circuit board is generally fabricated by stacking an electrically insulating layer (2) on an internal layer circuit board including an electrically insulating layer (1) and a conductor circuit (1) formed on a surface of the electrically insulating layer (1), forming a conductor circuit (2) on the electrically insulating layer (2) and if necessary, further stacking the electrically insulating layers and the conductor circuits in several stages.

When wiring is formed at a high density in a multi-layer construction as described above, exothermy occurs in the circuit board and in an electronic device. The electrically insulating layer can use a material blended with a halogen-type flame retardant as described in Japanese Unexamined Patent Publication No. 2-255848, for example, to impart flame resistance. The material blended with the halogen-type flame retardant generates halogen-type detrimental substances when it is burnt. Due to problems of environmental destruction and the greenhouse effect, however, the use of halogen-type flame retardants has been restricted. Therefore, a material providing flame resistance equivalent to that of the flame retardants of the prior art has been desired.

DISCLOSURE OF THE INVENTION

It is an object of the invention to provide a multi-layer circuit board excellent in insulating property and adhesion but not generating detrimental substances when it is burnt, and a curable composition suitable for providing the circuit board.

The inventor of the invention has conducted intensive studies to accomplish the object described above, has found that a multi-layer circuit board excellent in insulating property and adhesion, but not generating detrimental substances when burnt, can be obtained by use of a curable composition containing an insulating resin and a nitrogen type curing agent containing a vinyl group and an epoxy group, has found further that a multi-layer circuit board excellent in flame resistance, insulating property and adhesion but not generating detrimental substances when burnt can be obtained by use of a curable composition containing an aromatic polyether polymer or an alicyclic olefin polymer, a specific nitrogen type curing agent and a phosphorus type flame retardant, and has completed the invention on the basis of these findings.

Therefore, the invention provides a curable composition containing an aromatic polyether polymer, a nitrogen-type curing agent containing a vinyl group and an epoxy group and a phosphorus-type flame retardant; a curable composition containing an alicyclic olefin polymer, a nitrogen-type curing agent and a phosphorus-type flame retardant; and a curable composition containing an insulating resin and a nitrogen-type curing agent containing a vinyl group and an epoxy group.

The invention also provides a multi-layer circuit board fabricated by stacking electrically insulating layers formed by curing the curable composition described above.

BEST MODE FOR CARRYING OUT THE INVENTION

A curable composition according to the invention contains an insulating resin and a specific nitrogen type curing agent.

The insulating resin that constitutes the curable composition according to the invention includes known insulating resins used for forming an electrically insulating layer. Examples of the resins include an epoxy resin, a phenol resin, an acryl resin, a polyimide resin, a polyamide resin, a polyisocyanate resin, a polyester resin, a polyphenylether resin and an alicyclic olefin polymer.

A suitable curable composition used in the invention contains an alicyclic olefin polymer or an aromatic polyether polymer as the insulating resin, and particularly suitably contains the alicyclic olefin polymer.

The alicyclic olefin polymer constituting the curable composition is a polymer of olefins having the alicyclic structure. The alicyclic structure includes a cycloalkane structure and a cycloalkene structure, but the cycloalkane structure is more preferred from the aspect of mechanical strength and heat resistance. The alicyclic structure includes a monocyclic structure, a polycyclic structure, a condensation polycyclic structure, a cross-linking alicyclic structure and a polycyclic structure comprising the combination of these cyclic structures. The number of carbon atoms that constitutes the alicyclic structure is not particularly limited, but is generally from 4 to 30, preferably 5 to 20 and more preferably 5 to 15. When the number of carbon atoms is within this range, various properties such as mechanical strength, heat resistance and moldability are balanced at a suitable levels. The alicyclic olefin polymer used in the invention is generally of a thermoplastic type.

The alicyclic olefin polymer generally contains repeating units derived from an olefin having the alicyclic structure (hereinafter called sometimes "alicyclic olefin"). The proportion of the repeating units derived from the alicyclic olefin in the alicyclic olefin polymer is suitably selected in accordance with the object of its use, and is generally from 30 to 100 wt %, preferably 50 to 100 wt % and more preferably 70 to 100 wt %. When the proportion of the repeating units derived from the alicyclic olefin is excessively small, heat resistance becomes undesirably low. Repeating units other than those derived from the alicyclic olefin are not particularly limited, but are suitably selected in accordance with the object of use.

The alicyclic olefin polymer used in the invention preferably has polar groups. Examples of such polar groups are a hydroxyl group, a carboxyl group, an alkoxyl group, an epoxy group, a glycidyl group, an oxycarbonyl group, a carbonyl group, an amino group, an ester group and a carboxylic acid anhydride group. Preferred among them are the carboxyl group and the carboxylic acid anhydride group.

The alicyclic olefin polymer can be generally obtained by subjecting an alicyclic olefin to addition polymerization or ring-opening polymerization and, whenever necessary, hydrogenating an unsaturated bond, or by subjecting an aromatic olefin to addition polymerization and hydrogenating an aromatic ring of the polymer. The alicyclic olefin polymer having a polar group can be obtained, for example, 1) by introducing a compound having a polar group into the alicyclic olefin polymer through a denaturation reaction, 2) by (co)polymerizing a monomer containing a polar group as a (co)polymerization component, and 3) by (co) polymerizing a monomer containing a polar group such as an ester group as a (co)polymerization component and hydrolyzing the ester group. In the invention, the alicyclic olefin polymer obtained by the 1) method is suitable.

Examples of the alicyclic olefin used for obtaining the alicyclic olefin polymer are listed below: norbornene type monomers such as:

bicyclo[2.2.1]-hepto-2-ene (customary name: norbornane),
5-methyl-bicyclo[2.2.1]-hepto-2-ene, 5,5-dimethyl-bicyclo [2.2.1]-hepto-2-ene, 5-ethyl-bicyclo[2.2.1]-hepto-2-ene,
5-butyl-bicyclo-[2.2.1]-hepto-2-ene, 5-hexyl-bicyclo [2.2.1]-hepto-2-ene,
5-octyl-bicyclo[2.2.1]-hepto-2-ene,
5-octadecyl-bicyclo[2.2.1]-hepto-2-ene, 5-ethylidene-bicyclo[2.2.1]-hepto-2-ene,
5-methylidene-bicyclo[2.2.1]-hepto-2-ene,
5-vinyl-bicyclo[2.2.1]-hepto-2-ene,
5-propenyl-bicyclo[2.2.1]-hepto-2-ene,
5-methoxycarbonyl-bicyclo[2.2.1]-hepto-2-ene,
5-cyano-bicyclo[2.2.1]-hepto-2-ene,
5-methyl-5-methoxycarbonyl-bicyclo[2.2.1]-hepto-2-ene,
5-ethoxycarbonyl-bicyclo[2.2.1]-hepto-2-ene,
bicyclo[2.2.1]-hepto-5-enyl-2-methylpropionate,
bicyclo[2.2.1]-hepto-5-enyl-2-methyloctanate,
bicyclo[2.2.1]-hepto-2-ene-5,6-dicarboxylic acid anhydride,
5-hydromethylbicyclo[2.2.1]-hepto-2-ene,
5,6-di(hydroxymethyl)-bicyclo[2.2.1]-hepto-2-ene,
5-hydroxy-i-propylbicyclo[2.2.1]-hepto-2-ene,
5,6-dicarboxy-bicyclo[2.2.1]-hepto-2-ene,
bicyclo[2.2.1]-hepto-2-ene-5,6-dicarboxylic acid imide,
5-cyclopentyl-bicyclo[2.2.1]-hepto-2-ene,
5-cyclohexyl-bicyclo[2.2.1]-hepto-2-ene,
5-cyclohexenyl-bicyclo[2.2.1]-hepto-2-ene,
5-phenyl-bicyclo[2.2.1]-hepto-2-ene,
tricyclo[4.3.0.1$^{2,5}$]deca-3,7-diene (customary name: dicyclopentadiene)
tricyclo[4.3.0.1$^{2,5}$]deca-3-ene,
tricyclo[4.4.0.1$^{2,5}$]undeca-3,7-diene,
tricyclo[4.4.0.1$^{2,5}$]undeca-3,8-diene,
tricyclo[4.4.0.1$^{2,5}$]undeca-3-ene,
tetracyclo[7.4.0.1$^{10,13}$.0$^{2,7}$]-trideca-2,4,6-11-tetra-ene(alias: 1,4-methano-1,4,4a,9a-tetrahydrofluorene),
tetracyclo[8.4.0.1$^{11,14}$.0$^{3,8}$]-tetradeca-3,5,7,12-11-tetraene (alias: 1,4-methano-1,4,4a,5,10,10a-hexahydroanthracene),
tetracyclo[4.4.0.1$^{2,5}$.1$^{7,10}$]-dodeca-3-ene (customary name: tetracyclododecene),
8-methyl-tetracyclo[4.4.0.1$^{2,5}$.1$^{7,10}$]-dodeca-3-ene,
8-ethyl-tetracyclo[4.4.0.1$^{2,5}$.1$^{7,10}$]-dodeca-3-ene,
8-methylidene-tetracyclo[4.4.0.1$^{2,5}$.1$^{7,10}$]-dodeca-3-ene,
8-ethylidene-tetracyclo[4.4.0.1$^{2,5}$.1$^{7,10}$]-dodeca-3-ene,
8-vinyl-tetracyclo[4.4.0.1$^{2,5}$.1$^{7,10}$]-dodeca-3-ene,
8-propenyl-tetracyclo[4.4.0.1$^{2,5}$.1$^{7,10}$]-dodeca-3-ene,
8-methoxycarbonyl-tetracyclo[4.4.0.1$^{2,5}$.1$^{7,10}$]-dodeca-3-ene,
8-methyl-8-methoxycarbonyl-tetracyclo[4.4.0.1$^{2,5}$.1$^{7,10}$]-dodeca-3-ene,
8-hydroxymethyl-tetracyclo[4.4.0.1$^{2,5}$.1$^{7,10}$]-dodeca-3-ene,
8-carboxy-tetracyclo[4.4.0.1$^{2,5}$.1$^{7,10}$]-dodeca-3-ene,
8-cyclopentyl-tetracyclo[4.4.0.1$^{2,5}$.1$^{7,10}$]-dodeca-3-ene,
8-cyclohexenyl-tetracyclo[4.4.0.1$^{2,5}$.1$^{7,10}$]-dodeca-3-ene,
8-cyclohexenyl-tetracyclo[4.4.0.1$^{2,5}$.1$^{7,10}$]-dodeca-3-en
8-phenyl-tetracyclo[4.4.0.1$^{2,5}$.1$^{7,10}$]-dodeca-3-ene,
pentacyclo[6.5.1.1$^{3,6}$.0$^{2,7}$.0$^{9,13}$]-pentadeca-3,10-diene,
pentacyclo[7.4.0.1$^{3,6}$.1$^{10,13}$.0$^{2,7}$]-pentadeca-4,11-diene,
tetracyclo[6.5.0.1$^{2,5}$.0$^{8,13}$]trideca-3,8,10,12-tetraene, and
tetracyclo[6.6.0.1$^{2,5}$.1$^{8,13}$]tetradeca-3,8,10,12-tetraene;
monocyclic cycloalkene such as cyclobutene, cyclopentene, cyclohexene, 3,4-dimethylcyclopentene, 3-methylcyclohexene, 2-(2-methylbutyl)-1-cyclohexene, cyclooctene, 3a,5,6,7a-tetrahydro-4,7-methano-1H-indene and cycloheptene;
vinyl alicyclic hydrocarbon monomers such as vinylcyclohexene and vinylcyclohexane; and
alicyclic conjugated diene monomers such as cyclopentadiene and cyclohexadiene.

Examples of the aromatic olefin are styrene, α-methylstyrene and divinylbenzene.

The alicyclic olefin and/or aromatic olefin may be used either alone or in combination of two or more kinds.

The alicyclic olefin polymer may be prepared by copolymerising the alicyclic olefin and/or the aromatic olefin with a monomer copolymerisable with these olefins.

Examples of the monomers copolymerisable with the alicyclic olefin or the aromatic olefin are olefins or α-olefins of 20 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene and 1-eicosane; and non-conjugated dienes such as 1,4-hexadiene, 4-methyl-1,4-hexadiene, 5-methyl-1,4-hexadiene and 1,7-octadiene. These monomers can be used either alone or in combination with two or more kinds.

The polymerization method of the alicyclic olefin or/and the aromatic olefin and the hydrogenation method that is carried out whenever necessary is not limited and, in particular, they can be conducted by a known method.

Concrete examples of the alicyclic olefin polymers are ring-opened polymers of norbornene type monomers and their hydrogenated products, addition polymers of the norbornene type monomers, addition polymers of the norbornene type monomers and vinyl compounds, monocyclic cycloalkene polymers, alicyclic conjugated diene polymers, vinyl type alicyclic hydrocarbon polymers and their hydrogenated products, and aromatic hydrogenated products of aromatic olefin polymers. Preferred among them are the ring-opened polymers of the norbornene type monomers and their hydrogenated products, the addition polymers of the norbornene type monomers, the addition polymers of the norbornene type monomers and the vinyl compounds and the aromatic ring hydrogenated products of the aromatic olefin polymers. Particularly preferred is the hydrogenated product of the ring-opened polymer of the norbornene type monomers. The alicyclic olefin polymers can be used either alone or in combination of two or more kinds.

The alicyclic olefin polymer is not particularly limited by its molecular weight. The molecular weight of the alicyclic olefin polymer is generally 1,000 to 1,000,000, preferably 5,000 to 500,000 and more preferably 10,000 to 250,000 in terms of a weight average molecular weight (Mw) calculated as polystyrene measured by gel permeation chromatography (GPC) using cyclohexane or toluene as a solvent. When the weight average molecular weight of the alicyclic olefin polymer is within this range, heat resistance, flatness of the surface of a molding, and so forth, are balanced satisfactorily and suitably.

The molecular weight distribution of the alicyclic olefin polymer is ordinarily 5 or less, preferably 4 or less and more preferably 3 or less in terms of a ratio (Mw/Mn) of the weight average molecular weight (Mw) measured by GPC using cyclohexane or toluene as the solvent to the number average molecular weight (Mn).

The weight average molecular weight (Mw), the range of the molecular weight distribution (Mw/Mn) and the measurement method can be suitably adapted to the norbornene type polymers, but are not particularly restrictive. In the case of the alicyclic olefin polymers, the weight average molecular weight and the molecular weight distribution of which cannot be measured by the method described above, it is possible to use polymers having a melt viscosity and a degree of polymerization to such an extent that a resin layer can be formed by an ordinary melt processing method.

The glass transition temperature of the alicyclic olefin polymer may be suitably selected in accordance with the object of use, and is generally 50° C. or above, preferably 70° C. or above, more preferably 100° C. or above and most preferably 125° C. or above.

The aromatic polyether polymer constituting the curable composition is a polyether having an aromatic ring, and can be generally obtained by causing a 2,6-disubstituted phenol such as 2,6-dimethyl phenol or 2,6-diphenyl phenol to react with oxygen in the presence of a basic copper (II) salt such as a copper (II) amine complex. Examples of the aromatic polyether polymers are polyphenylene ether and modified polyphenylene ether. Among them, denatured polyphenylene ether having a small dielectric constant and a small dielectric tangent is suitably used.

The nitrogen type curing agent used in the invention contains a nitrogen atom or more than one nitrogen atom. The curing agent may be an ionic curing agent, a radical curing agent or a curing agent that is both ionic and radical so long as it contains nitrogen. However, the ionic curing agent is preferred from the aspects of insulation resistance, heat resistance, chemical resistance and compatibility with an insulating resin. Preferably, the nitrogen-type curing agent used in the invention does not contain a halogen.

Examples of the nitrogen-type curing agent include aliphatic polyamines such as hexamethylenediamine, triethylenetetramine, diethylenetriamine and tetraethylenepentamine; alicyclic polyamines such as diaminocyclohexane, 3(4),8(9)-bis(aminomethyl)tricyclo[5.2.1.0$^{2,6}$]decane, 1,3-(diaminomethyl)cyclohexane, menthenediamine, isophoronediamine N-aminoethylpiperazine, bis(4-amino-3-methylcyclohexyl) methane and (4-aminocyclohexyl)methane; aromatic polyamines such as 4,4'-diaminodiphenyl ether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenylsulfone, methaphenylenediamine, and methaxylylenediamine; polyamides such as nylon-6, nylon-66, nylon-610, nylon-11, nylon-612, nylon-12, nylon-46, methoxymethylated polyamide, polyhexamethylenediamine terephthalamide and polyhexamethylene isophthalamide; isocynates such as hexamethylene diisocyanate and toluylene diisocyanate; isocyanuric acid; triallylcyanurate; 1-allylisocyanurate, 1,3-diallylisocyanurate, 1,3-diallyl-5-benzyl isocyanurate, triallylisocyanurate, 1-allyl-3,5-dibenzylisocyanurate; and isocyanurates such as 1-allyl-3,5-diglycidylisocyanurate, 1,3-diallyl-5-glycidylisocyanurate and triglycidyl isocyanurate. Preferred among them are nitrogen type curing agents that contain the vinyl group and the epoxy group. Particularly preferred are those isocyanurate type curing agents that contain the vinyl group and the epoxy group but do not contain a halogen such as 1-allyl-3,5-diglycidylisocyanurate and 1,3-diallyl-5-glycidyl isocyanurate.

These nitrogen-type curing agents can be used either alone or in combination of two or more kinds, and their blend proportion is generally 5 to 150 parts by weight, preferably 15 to 110 parts by weight and more preferably 30 to 100 parts by weight, on the basis of 100 parts by weight of the insulating resin.

The phosphorus-type flame retardant used in the invention is a phosphorus-containing compound that is generally used as a flame retardant. Examples of the phosphorus type flame retardant include triphenyl phosphate, tricresyl phosphate, trixylenyl phosphate, trimethyl phosphate, triethyl phosphate, tributyl phosphate, trioctyl phosphate, tributoxyethyl phosphate, octyldiphenyl phosphate, cresyldiphenyl phosphate, xylenyldiphenyl phosphate, resorcinolbis (diphenyl) phosphate, 2-ethylhexyldiphenyl phosphate, dimethylmethyl phosphate, triallyl phosphate, diethylbis (hydroxyethyl)aminomethyl phosphate, and phosphoric acid ester compounds such as condensed phosphoric acid esters; and inorganic phosphorus compounds such as phosphoric acid, phosphonic acid, metaphosphoric acid; pyrophosphoric acid; sodium phosphinate monohydrate, sodium phosphinate pentahydrate, sodium hydrogenphophonate 2.5 hydrate, sodium phosphate dodecahydrate, disodium hydrogenphosphate dodecahydrate, sodium dihydrogenphosphate monohydrate, sodium dihydrogenphosphate dihydrate, sodium hypophosphate decahydrate, sodium diphosphate decahydrate, disodium dihydrogendiphosphate, disodium dihydrogendiphosphate hexahydrate, sodium triphosphate, sodium cyclotetraphosphate, potassium phosphinate, potassium phosphonate, potassium hydrogenphosphinate, potassium phosphate, dipotassium hydrogenphosphate, potassium dihydrogenphosphate, potassium diphosphate trihydrate, potassium metaphosphate and red phosphorus; phosphate compounds such as ammonium polyphosphate, polyphosphoric acid melamine salts, sulfates of polyphosphoric acid, guanidine phosphate and guanylurea phosphate; phosphoric acid ester amide compounds such as diphenylphosphoric acid ester-2-propenylamide, diphenylphosphoric acid ester-2-hydroxyethylamide, diphenylphosphoric acid ester-di(2-hydroxyethyl)amide, diphenylphosphoric acid ester-di-2-cyanoethylamide, diphenylphosphoric acid ester-p-hydroxyphenylamide, diphenylphosphoric acid ester-m-hydroxyphenylamide, and diphenylphosphoric acid ester-cyclohexylamide; and phosphoric acid amide compounds such as phenylphosphoric acid ester-di-N,N-phenylmethylamide and phenylphosphoric acid ester-di-N-cyclohexylamide.

The amount of the phosphorus-type flame retardant is generally 1 to 100 parts by weight and preferably 5 to 60 parts by weight, on the basis of 100 parts by weight of the insulating resin. Preferred among the flame retardants listed above are the flame retardants not containing a halogen, and particularly preferred are phosphoric acid ester amide compounds or phosphoric acid amide compounds that do not contain a halogen.

Examples of the peroxides used in the invention include benzoyl peroxide, dichlorobenzoyl peroxide, dicumyl peroxide, di-tert-butyl peroxide, 2,5-dimethyl-2,5-(peroxide benzoate)hexine-3,1,4-bis(tert-butyloxyisopropyl) benzene, lauroyl peroxide, tert-butyl peracetate, 2,5-dimethyl-2,5-di (tert-butyl peroxy)hexine-3,2,5-dimethyl-2,5-di(tert-butylperoxy)hexane, tert-butyl perbenzoate, tert-butyl perphenylacetate, tert-butyl perisobutylate, tert-butylper-sec-octoate, tert-butyl perpiperate, cumyl perpiparate, tert-butylperdiethyl acetate, methyl ethyl ketone peroxide, cyclohexanone peroxide, 1,1-bis(t-butylperoxy)3,3,5-trimethylcyclohexane, 2,2-bis(t-butylperoxy)butane, t-butyl hydroperoxide, 2,5-dimethylhexane-2,5-dihydroperoxide, dicumyl peroxide, 2,5-dimethyl-2,5-di(t-butylperoxy)hexine-3,α,α'-bis(t-butylperoxy-m-isopropyl)benzene, octanoyl peroxide, isobutyryl peroxide and peroxy dicarbonate. Among these peroxides, those not containing a halogen element are preferred.

The amount of the peroxide is generally 0.1 to 40 parts by weight and preferably 1 to 20 parts by weight on the basis of 100 parts by weight of the insulating resin. When the amount of the peroxide is within this range, a lamination property, such as the burying of wiring, is superior.

Other components may be blended into the curable composition used in the invention, whenever desired. The blend components include insulating resins other than the insulating resin described above, flexible polymers, fillers, heat resistance stabilizer, weatherability stabilizers, antioxidants, leveling agents, antistatic agents, slip agents, anti-blocking agents, anti-hazing agents, lubricants, dyes, pigments, natural oil, synthetic oil, wax, emulsifiers and fillers. The blend proportion of these agents is suitably selected within the range that does not spoil the object of the invention.

The flexible polymer is a polymer that generally has Tg of not higher than 30° C. Concrete examples include a diene-type rubber such as natural rubber, polyisobutylene rubber, butyl rubber, polybutadiene rubber, polyisoprene rubber, acrylonitrile-butadiene copolymer rubber, styrene-butadiene copolymer rubber, styrene-isoprene copolymer rubber and styrene-butadiene-isoprene ternary copolymer rubber, and their hydrogenated products; a saturated polyolefin rubber such as ethylene-α-olefin copolymer and propylene-other α-olefin copolymer; an α-olefin-diene-type polymer rubber such as ethylene-propylene-diene copolymer, α-olefin-diene copolymer, isobutylene-isoprene copolymer and isobutylene-diene copolymer; a specific rubber such as urethane rubber, polyether rubber, acryl rubber, propylene oxide rubber and ethylene acryl rubber; styrene type thermoplastic elastomers such as styrene-butadiene-styrene block copolymer rubber and styrene-isoprene-styrene block copolymer rubber, and their hydrogenated products; 1,2-polybutadiene type thermoplastic elastomer; and silicone rubber.

Examples of the resin are polyolefins such as low density polyethylene, high density polyethylene, linear low density polyethylene, ultra-low density polyethylene, polypropylene, syndiotactic polypropylene, polybutene and polypentene; polyamides such as nylon 66; ethylene-ethyl acrylate copolymer and ethylene-vinyl acetate copolymer; polyesters; polycarbonate; acryl resin; polyimide; and silicone resin.

These polymers or resins can be used either alone or in combination of two or more kinds. The blend ratio of other polymers is generally 100 parts by weight or less, preferably 70 parts by weight or less and more preferably 50 parts or less, on the basis of 100 parts by weight of the insulating resin. The lower limit is 0 parts by weight.

To improve the insulating resistance and the peeling resistance, a thiol compound and a silane compound are preferred as the blending agent. The blend amount of the thiol compound or silane compound is generally 0.001 to 30 parts by weight and preferably 0.01 to 10 parts by weight on the basis of 100 parts by weight of the insulating resin. When the blend amount is too small, the effect of improving the insulating resistance and the peel resistance cannot be acquired easily and, when it is too great, the heat resistance and the chemical resistance are likely to drop.

The curable composition according to the invention is excellent in flame resistance, an insulating property and in adhesion and does not, moreover, generate detrimental substances such as a halogen compound when it is burnt. Therefore, the curable composition can be utilized for an insulating film of multiplayer circuit boards, an inter-level insulating film of semiconductor devices, a solder resist, a spacer and a cell for liquid crystal display devices, an adhesive, and so forth.

The multi-layer circuit board according to the invention has an electrically insulating layer (2) that is obtained by curing the curable composition, and is laminated thereon.

The electrically insulating layer (2) is generally formed on the internal layer board. The internal layer board includes an electrically insulating layer (1) and a conductor circuit layer (1) formed on a surface of the electrically insulating layer (1).

The conductor circuit layer (1) constituting the internal layer board is an electric circuit formed of an electric conductor such as an electrically conductive metal, and its circuit construction is the same as the circuit construction used in ordinary multi-layer circuit boards.

Concrete examples of the internal layer board are a printed wiring board and a silicon wafer board. The thickness of the internal layer board is generally from 50 μm to 2 mm, preferably from 60 μm to 1.6 mm and more preferably from 100 μm to 1 mm.

The material of the electrically insulating layer (1) constituting the internal layer board is not particularly limited so long as it has an electric insulating property. Examples of the material of the electrically insulating layer (1) are those products that are obtained by curing a curing composition containing an alicyclic olefin polymer, an epoxy resin, a maleimide resin, a (meth)acrylic resin, diallyl phthalate resin, a triazine resin or a polyphenylene ether. The internal layer board may contain glass fiber, etc, to improve the strength.

Methods of forming the electrically insulating layer (2) on the internal layer substrate include a method that applies a solution or dispersion of the curable composition to the internal layer board, removing and drying a solvent to form a coating layer of the curable composition, and curing the composition, and a method that molds the curable composition into a film or sheet, laminating the sheet or film onto the internal layer board by heat bonding, etc, and curing the sheet or film to form the electrically insulating layer (2). In the invention, the latter method that forms the sheet or film and then forms the insulating layer is preferred.

The method of molding the curable composition into the sheet or film is not particularly limited but, in the invention, a solution casting method or a melt casting method is preferably employed. According to the melt casting method, the solution or dispersion of the curable composition is applied to a support and the solvent is dried and removed.

Examples of the solvent for dissolving or dispersing the curable composition of the invention include aromatic hydrocarbon solvents such as toluene, xylene, ethylbenzene and trimethylbenzene; aliphatic hydrocarbon solvents such as n-pentane, n-hexane and n-heptane; alicyclic hydrocarbon solvents such as cyclopentane and cyclohexane; halogenated hydrocarbon solvents such as chlorobenzene, dichlorobenzene and trichlorbenzene; and ketone type solvents such as methyl ethyl ketone, methyl isobutyl ketone, cyclopentaonone and cyclohexanone. These solvents may be used either alone or in a combination of two or more kinds.

Preferred among these solvents are mixed solvents prepared by mixing non-polar solvents such as the aromatic hydrocarbon solvents or the alicyclic hydrocarbon solvents with polar solvents such as the ketone type solvent. The mixing ratio of the non-polar solvent and the polar solvent can be selected appropriately but is generally 5:95 to 95:5, preferably 10:90 to 90:10 and more preferably 20:80 to 80:20 in terms of the weight ratio.

The use amount of the solvent is appropriately selected in accordance with the object of use, but is such that the solid content concentration in the solution or dispersion of the curable composition is generally 5 to 70 wt %, preferably 10 to 65 wt % and more preferably 20 to 60 wt %.

The curable composition may be dispersed or dissolved in the solvent in a customary manner by, for example, using a stirrer with a magnetic stirrer, a high-speed homogenizer, a disperser, a planetary stirrer, a two-axial stirrer, a ball mill or three-roll mixer.

The support used for the solution casting method is a resin film or a metal foil. A thermoplastic resin film is generally used for the resin film. Concrete examples include a polypropylene film, a polyethylene film, a polycarbonate film, a polyethylene terephthalate film, a polyethylene naphthalate film, a polyarylate film and a nylon film. Among these resin films, the polyethylene terephthalate film and the polyethylene naphthalate film are desirable from the aspects of heat resistance, chemical resistance and peeling property after lamination. Examples of the metal foil are a copper foil, an aluminum foil, a nickel foil, a chromium foil, a gold foil and a silver foil. The copper foil, particularly an electrolytic copper foil or a rolled copper foil, is suitable because it has high conductivity and is economically available. The thickness of the support is not particularly limited. From the aspect of the working factor, however, the thickness is generally 1 to 150 $\mu$m, preferably 2 to 100 $\mu$m and more preferably 3 to 50 $\mu$m.

The coating method includes dip coating, roll coating, die coating and slit coating. The condition for drying and removing the solvent is suitably selected in accordance with the kind of the solvent. The drying temperature is generally 20 to 300° C. and preferably 30 to 200° C., and the drying time is generally 30 seconds to 1 hour and preferably 1 to 30 minutes.

The thickness of the film or sheet is generally 0.1 to 150 $\mu$m, preferably 0.5 to 100 $\mu$m and more preferably 1.0 to 80 $\mu$m. Incidentally, when it is desired to obtain the film or sheet as a single substance, the film or sheet is formed on the support and is then peeled from the support.

To laminate the film or sheet consisting of the curable composition on the internal layer board, the film or sheet having the support is arranged in such a fashion that the film or sheet comes into contact with the surface of the internal layer board and it is heat bonded by use of a pressing machine such as a press laminator, a press, a vacuum laminator, a vacuum press or a roll laminator. Heat bonding is preferably carried out in vacuum so as to improve the burying property of the wiring and to suppress the occurrence of air bubbles. The temperature of heat bonding is generally 30 to 250° C. and preferably 70 to 200° C. The pressure is generally 0.1 to 200 kg/cm$^2$ and preferably 1 to 100 kg/cm$^2$. The bonding time is generally 30 seconds to 5 hours and preferably 1 minute to 3 hours. Generally, the pressure is reduced to 760 to 0.01 mmHg and preferably to 300 to 0.1 mmHg.

To cure the curable composition, the curable composition is generally heated. The curing temperature is appropriately selected in accordance with the kind of the nitrogen-type curing agent but is generally 30 to 400° C., preferably 70 to 300° C. and more preferably 100 to 200° C. The curing time is generally 0.1 to 5 hours and preferably 0.5 to 3 hours. When the film or sheet having the support is laminated on the internal layer board, the film or sheet formed of the curable composition may be heated and cured while it has the support. Generally, however, the film or sheet formed of the curable composition is heated and cured after the support is peeled.

On the other hand, when the film or sheet having the support is laminated on the internal layer board, the support is wholly removed, and the film or sheet is cured to give the electrically insulating layer (2). Incidentally, when the support is an electrically conductive metal foil, the metal foil may be left either partially or wholly and may be used as the conductor circuit (2).

In the multi-layer circuit board according to the invention, a conductor circuit layer (2) can be formed on the surface of the electrically insulating layer (2). A method of forming a new conductor circuit on the electrically insulating layer (2) includes plating and sputtering. To improve the bonding strength between the electrically insulating layer (2) and the conductor circuit (2), the surface of the electrically insulating layer (2) is brought into contact with a solution of permanganic acid or chromic acid, or a plasma treatment is applied to the surface of the electrically insulating layer (2), before plating or sputtering is carried out.

In the invention, it is also possible to laminate new electrically conductive layers and conductor circuits in multiple layers by using the boards obtained by forming the electrically insulating layer (2) and the conductor circuit (2) as new internal layer boards.

In the multi-layer circuit, a via-hole electrically connects the conductor circuits (1) and (2) separated by the electrically insulating layers (2). The via hole can be formed by physical treatment such as drilling or laser processing, or by so-called "photolithography" that optically cures the curable composition while it is masked, and removes non-cured portions. Among these via formation methods, laser processing using a $CO_2$ laser, an excimer laser or a UV-YAG laser is preferred because it can form the via hole in a smaller size without altering the properties of the insulating layer.

In the multi-layer circuit board described above, a part of the conductor circuit may be a metal power supply layer, a metal ground layer or a metal shield layer.

In electronic appliances such as computers and cellular phones, the multi-layer circuit board can be used as a printed wiring board to which semiconductor devices such as a CPU and a memory, and other packaging components, are packaged. A multi-layer circuit board having miniature wiring, in particular, is suitable as a high-density printed wiring board in high-speed computers and mobile terminals used in a high frequency range.

The invention will be hereinafter explained concretely with reference to Examples and Comparative Examines. The term "part or parts" used in Examples represents "part or parts by weight" unless otherwise specified.

Evaluation methods in the following Examples are as follows.

(1) Molecular Weight:

The molecular weight is measured as a polystyrene equivalent value by gel permeation chromatography (GPC) using toluene as a solvent, unless otherwise specified.

(2) Hydrogenation Ratio and Carboxyl Group Content:

They are measured by $^1$H-NMR.

(3) Glass Transition Temperature (Tg):

The glass transition temperature Tg is measured by differential scanning calorimetry.

(4) Adhesion:

The multi-layer circuit board is treated for 100 hours in saturated vapor condition at 121° C., and measurement is made in accordance with JIS K 5400. The evaluation points stipulated by JIS K 5400 are evaluated in accordance with the following standard:

○: 8 points or more, Δ: less than 8 to 4 points or more, X: less than 4 points (5) Flame Resistance:

The multi-layer circuit board is cut into strips in accordance with UL-STD-94 and the flame resistance test is carried out.

◎: V0 level, Δ: V1 level, X: burnt (6) Insulating Property:

A comb-shaped electrode having a wiring distance of 50 microns and a wiring width of 50 microns is formed on the second layer electrically insulating layer of the multi-layer circuit board. While a DC voltage of 50 V is applied, the electrode is left standing under a 120° C. saturated vapor condition, and 300 hours later the electric resistance value is measured.

◎: electric resistance of $10^9$ Ω or more, ○: $10^8$ to less than $10^9$ Ω, Δ:less than $10^8$ Ω and not having short-circuit, X: short-circuited

EXAMPLE 1

8-ethylidene-tetracyclo[4.4.0.1$^{2,5}$.1$^{7,10}$]-dodeca-3-ene was subjected to ring-opening polymerization and then to a hydrogenation reaction. There was obtained a hydrogenated polymer having a number average molecular weight (Mn) of 31,200, a weight average molecular weight (Mw) of 55,800 and Tg of about 155° C. A hydrogenation ratio of the resulting polymer was 99%.

Next, 28 parts of the polymer so obtained, 10 parts of maleic anhydride and 3 parts of dicumyl peroxide were dissolved in 130 parts of t-butylbenzene, and a reaction was carried out at 140° C. for 6 hours. The resulting solution of the reaction product was poured into 300 parts of methanol, and was coagulated to give a maleic acid denatured hydrogenated polymer. This denatured hydrogenated polymer was dried in vacuum at 100° C. for 20 hours. The denatured hydrogenated polymer had molecular weight Mn of 33,200, Mw of 68,300 and Tg of 170° C. A maleic acid group content was 25 mol %.

Next, 100 parts of the denatured hydrogenated polymer described above, 50 parts of 1,3-diallyl-5-glycidylisocyanurate, 5 parts of dicumyl peroxide and 40 parts of polyphosphoric acid melamine salt having a mean particle size of 3 μm were dissolved in a mixed solvent consisting of 175 parts of toluene and 117 parts of methyl isobutyl ketone to give a varnish.

After the varnish was filtered with a Teflon micro-filter having a pore diameter of 10 microns, it was then applied to a polyethylene naphthalate film (carrier film) having a size of 300 mm square and a thickness of 75 microns by use of a die coater. The varnish was then dried at 120° C. for 210 seconds inside a nitrogen oven to give a dry film with a carrier film having a resin thickness of 35 microns.

The dry films with the carrier film were superposed with the resin surface thereof facing inward on both surfaces of a 0.8 mm-thick core board (obtained by causing a glass cloth to be impregnated with a varnish containing a glass filler and an epoxy resin not containing a halogen) on which a conductor circuit layer having wiring width and wiring distance of 75 microns and wiring layer thickness of 18 microns and plating through-holes having a diameter of 0.2 mm were formed. Heat bonding was conducted by reducing a pressure to 1 mmHg, at a temperature of 150° C. and a pressure of 5 kgf/cm$^2$ for 30 minutes by using a vacuum laminator to give a laminated board. The resulting laminated board was withdrawn from the laminator, and only the polyethylene naphthalate film was peeled. The laminated board was heated at 180° C. for 60 minutes inside a nitrogen oven to cure the resin and to form an insulating layer.

A UV-YAG laser was used to form via-holes for inter-layer connection, having a diameter of 30 microns at the insulating layer portion of the resulting laminated board. Next, the laminated board was washed with water, dried and exposed to a 1,000 W argon plasma for 10 minutes.

Next, the laminated board was subjected to copper sputtering treatment and a copper thin film having a thickness of 0.1 micron was formed on the wall surface of the via-holes and on the entire surface of the laminated board.

A commercially available photosensitive dry film was heat bonded to the surface of the laminated board, and a mask having a predetermined pattern was brought into close contact with the dry film, and was exposed and developed to give a resist pattern. Electrolytic copper plating was applied to portions not covered with resist to form an electrolytic copper plating film having a thickness of 18 microns. Next, the resist pattern was peeled and removed by use of a peeling solution, and the sputter copper thin film hidden below the resist formation portion was removed by use of a mixed solution of copper (II) chloride and hydrochloric acid to thereby form a wiring pattern. Finally, annealing was carried out at 170° C. for 30 minutes to give a circuit board.

A solution for pre-treating the conductor layer was prepared by dissolving 0.1 part of 2-dibutylamino-4,6-dimercapto-S-triazine in 100 parts of isopropyl alcohol. The circuit board obtained in the manner described above was immersed in this pre-treating solution for 1 minute and was then dried at 90° C. for 15 minutes. The circuit board so treated was used as the core board described above, and the insulating layer and the conductor layer were repeatedly formed in the same way as described above to obtain a multi-layer circuit board having six layers in total on both surfaces. The evaluation result is tabulated in Table 1. As the curable composition constituting the dry film did not contain a halogen-containing material, halogen-type detrimental substances were not generated during the flame resistance test.

EXAMPLE 2

A multi-layer circuit board was obtained in the same way as in Example 1 with the exception that phosphoric acid ester amide expressed by the chemical formula (1) was used in place of the polyphosphoric acid melamine salt used in Example 1. The evaluation result is tabulated in Table 1.

Halogen-type detrimental substances were not generated in the flame resistance test.

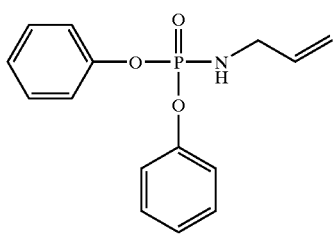

(1)

EXAMPLE 3

Two parts of a polymer obtained by oxidative polymerization of 2,2-bis(3,5-methyl-4-hydroxyphenyl)propane and 2,6-dimethylphenol was dissolved in a mixed solvent consisting of 100 parts by volume of toluene and 5 parts by volume of N,N,N',N'-tetramethylethylenediamine, and after 10.8 parts by volume of n-butyl lithium (1.54 mol/liter, hexane solution) was added, the mixture was reacted at room temperature for 1 hour in a nitrogen atmosphere. The reaction solution was subsequently cooled down to −70° C., and after 2 parts of propargyl bromide was added, the reaction solution was stirred. The reaction solution was poured into a large amount of methanol to precipitate the polymer. After filtration, the polymer was washed thrice with methanol to give a white powdery propargyl group substituted polyphenylene ether polymer. The substitution ratio of the propargyl group was determined as 5% by 1H-NMR.

100 parts of the propargyl group substituted polyphenylene ether polymer, 50 parts of 1-allyl-3,5-diglycidyl isocyanurate, 5 parts of dicumyl peroxide and a polyphosphoric acid melamine salt having a mean particle size of 3 μm were dissolved in 200 parts of trichloroethylene to give a varnish. A multi-layer circuit board was obtained by use of the varnish in the same way as in Example 1. The evaluation result was tabulated in Table 1. Halogen-type detrimental substances were not generated in the flame resistance test.

COMPARATIVE EXAMPLE 1

A multi-layer circuit board was obtained in the same way as in Example 1 with the exception that triallyl-1,2,4-benzenetricarboxylate was used in place of 50 parts of 1,3-diallyl-5-glycidylisocyanurate used in Example 1. The evaluation result is tabulated in Table 1. Halogen type detrimental substances were not generated, but the multi-layer circuit board did not have any flame resistance.

TABLE 1

| property | adhesion | flame resistance | insulating |
|---|---|---|---|
| Example 1 | ⊚ | ⊚ | ⊚ |
| Example 2 | ⊚ | ⊚ | ⊚ |
| Example 3 | ○ | ⊚ | ○ |
| Comp. Ex. 1 | ⊚ | X | ⊚ |

INDUSTRIAL APPLICABILITY

The curable composition according to the invention can easily provide a multi-layer circuit board having high adhesion and high insulating property. The curable composition does not generate halogen-type detrimental substances when burnt, and is excellent in environmental safety. The multi-layer circuit board obtained using the curable composition can be used as a printed wiring board for packaging semiconductor devices such as a CPU and memories and other packing components in electronic appliances such as computers and mobile telephones. A multi-layer circuit board having miniature wiring, in particular, is suitable as a high-density printed wiring board in high-speed computers and mobile terminals used in the high frequency band.

What is claimed is:

1. A curable composition comprising an electrically insulating resin and a nitrogen-type curing agent, wherein said nitrogen-type curing agent comprises a vinyl group and an epoxy group, wherein said electrically insulating resin is at least one selected from the group consisting of epoxy resin, phenol resin, acryl resin, polyimide resin, polyamide resin, polyisocyanate resin, polyphenylether resin and alicyclic olefin resin.

2. A curable composition comprising an aromatic polyether polymer, a nitrogen-type curing agent and a phosphorus-type flame retardant, wherein said nitrogen-type curing agent comprises a vinyl group and an epoxy group.

3. A curable composition comprising an alicyclic olef in polymer; a nitrogen-type curing agent; and a phosphorus-type flame retardant, wherein said nitrogen-type curing agent comprises a vinyl group and an epoxy group.

4. A curable composition according to claim 2 or claim 3, which further comprises peroxide.

5. A multi-layer circuit board having laminated thereon an electrically insulating layer obtained by curing said curable composition according to claim 2 or claim 3.

* * * * *